(12) United States Patent
Kugler

(10) Patent No.: US 10,164,193 B2
(45) Date of Patent: Dec. 25, 2018

(54) ORGANIC LIGHT-EMITTING DEVICE

(71) Applicants: Cambridge Display Technology Limited, Godmanchester (GB); Sumitomo Chemical Company Limited, Tokyo (JP)

(72) Inventor: Thomas Kugler, Godmanchester (GB)

(73) Assignees: Cambridge Display Technology Limited, Godmanchester (GB); Sumitomo Chemical Company Limited, Tokyo (JP)

(*) Notice: Subject to any disclaimer, the term of this patent is extended or adjusted under 35 U.S.C. 154(b) by 93 days.

(21) Appl. No.: 15/304,293

(22) PCT Filed: Apr. 16, 2015

(86) PCT No.: PCT/GB2015/051156
§ 371 (c)(1),
(2) Date: Oct. 14, 2016

(87) PCT Pub. No.: WO2015/159090
PCT Pub. Date: Oct. 22, 2015

(65) Prior Publication Data
US 2017/0040541 A1    Feb. 9, 2017

(30) Foreign Application Priority Data

Apr. 16, 2014 (GB) .................................. 1406841.5
Feb. 17, 2015 (GB) .................................. 1502658.6

(51) Int. Cl.
*H01L 51/50* (2006.01)
*H01L 51/00* (2006.01)
(Continued)

(52) U.S. Cl.
CPC ........ *H01L 51/0039* (2013.01); *C08G 61/121* (2013.01); *H01L 51/0007* (2013.01);
(Continued)

(58) Field of Classification Search
None
See application file for complete search history.

(56) References Cited

U.S. PATENT DOCUMENTS

2002/0037429 A1*  3/2002  Sato .................... H01L 51/5221
                                                    428/690
2010/0141126 A1   6/2010  Otsu et al.
2013/0292657 A1  11/2013  Conway et al.

FOREIGN PATENT DOCUMENTS

EP    1 970 976 A1    9/2008
JP    2008-066569 A   3/2008
(Continued)

OTHER PUBLICATIONS

Combined Search and Examination Report dated Oct. 23, 2014 for Application No. GB 1406841.5.
(Continued)

*Primary Examiner* — Gregory D Clark
(74) *Attorney, Agent, or Firm* — Wolf, Greenfield & Sacks, P.C.

(57) ABSTRACT

An organic light-emitting device comprising an anode (103); a cathode (109); a light-emitting layer (105) between the anode and the cathode; and an electron-transporting layer (107) comprising an electron-transporting material between the cathode and the light-emitting layer, wherein the cathode comprises a layer of a conducting material (109B) and a layer of an alkali metal compound (109A) between the electron-transporting layer and the layer of conducting material and wherein the electron-transporting material is a conjugated polymer comprising arylene repeat units.

17 Claims, 2 Drawing Sheets

(51) Int. Cl.
 H01L 51/52   (2006.01)
 C08G 61/12   (2006.01)
 H01L 51/56   (2006.01)
(52) U.S. Cl.
 CPC ...... *H01L 51/0043* (2013.01); *H01L 51/5004* (2013.01); *H01L 51/5221* (2013.01); *H01L 51/5231* (2013.01); *H01L 51/56* (2013.01); *C08G 2261/12* (2013.01); *C08G 2261/148* (2013.01); *C08G 2261/1412* (2013.01); *C08G 2261/1424* (2013.01); *C08G 2261/1426* (2013.01); *C08G 2261/312* (2013.01); *C08G 2261/3142* (2013.01); *C08G 2261/3162* (2013.01); *C08G 2261/411* (2013.01); *C08G 2261/512* (2013.01); *C08G 2261/514* (2013.01); *C08G 2261/5242* (2013.01); *C08G 2261/95* (2013.01); *H01L 51/0003* (2013.01); *H01L 51/5012* (2013.01); *H01L 51/5072* (2013.01); *H01L 2251/301* (2013.01); *H01L 2251/552* (2013.01)

(56) References Cited

FOREIGN PATENT DOCUMENTS

| | | | | |
|---|---|---|---|---|
| JP | 2009-001742 A | | 1/2009 | |
| JP | 2011-238776 A | | 11/2011 | |
| JP | 2012-216811 | * | 11/2012 | ............ H01L 51/50 |
| JP | 2012-216811 A | | 11/2012 | |

OTHER PUBLICATIONS

International Search Report and Written Opinion dated Jun. 19, 2015 for Application No. PCT/GB2015/051156.

* cited by examiner

ORGANIC LIGHT-EMITTING DEVICE

RELATED APPLICATIONS

This application is a national stage filing under 35 U.S.C. § 371 of international PCT application, PCT/GB2015/051156, filed Apr. 16, 2015, which claims priority to United Kingdom patent application, GB 1406841.5, filed Apr. 16, 2014, and to United Kingdom patent application, GB 1502658.6, filed Feb. 17, 2015, each of which is incorporated herein by reference in its entirety.

BACKGROUND OF THE INVENTION

Electronic devices containing active organic materials are attracting increasing attention for use in devices such as organic light emitting diodes (OLEDs), organic photoresponsive devices (in particular organic photovoltaic devices and organic photosensors), organic transistors and memory array devices. Devices containing active organic materials offer benefits such as low weight, low power consumption and flexibility. Moreover, use of soluble organic materials allows use of solution processing in device manufacture, for example inkjet printing or spin-coating.

An organic light-emitting device has a substrate carrying an anode, a cathode and one or more organic light-emitting layers between the anode and cathode. An exemplary anode material is indium tin oxide (ITO). Cathodes include a single layer of metal such as aluminium, a bilayer of calcium and aluminium as disclosed in WO 98/10621; and a bilayer of a layer of an alkali or alkali earth compound and a layer of aluminium as disclosed in L. S. Hung, C. W. Tang, and M. G. Mason, Appl. Phys. Lett. 70, 152 (1997); T. Hasegawa, S. Miura, T. Moriyama, T. Kimura, I. Takaya, Y. Osato, and H. Mizutani, SID Int. Symp. Digest. Tech. Papers 35, 154 (2004); R. Suhonen, R. Krause, F. Kozlowski, W. Sarfert, R. Patzold, and A. Winnacker, Org. Electron. 10, 280 (2009).

Holes are injected into the device through the anode and electrons are injected through the cathode during operation of the device. Holes in the highest occupied molecular orbital (HOMO) and electrons in the lowest unoccupied molecular orbital (LUMO) of a light-emitting material combine to form an exciton that releases its energy as light. Charge-transporting layers may be provided.

WO 2012/133229 discloses a polymer of formula (B):

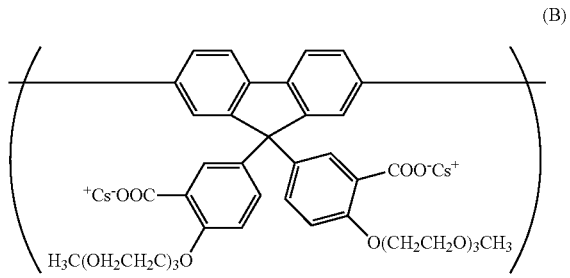

(B)

A light emitting layer may comprise a semiconducting host material and a light-emitting dopant wherein energy is transferred from the host material to the light-emitting dopant. For example, J. Appl. Phys. 65, 3610, 1989 discloses a host material doped with a fluorescent light-emitting dopant—that is, a light-emitting material in which light is emitted via decay of a singlet exciton.

Phosphorescent dopants are also known—that is, a light-emitting dopant in which light is emitted via decay of a triplet exciton.

Dopants with a high energy excited state require a host material with a large HOMO-LUMO bandgap to prevent quenching of emission. However, the present inventors have found that this large HOMO-LUMO bandgap can affect the efficiency of electron transport into the light-emitting layer or layers.

It is an object of the invention to improve efficiency of organic light-emitting devices, in particular devices containing a high energy excited state emitter.

It is a further object of the invention to improve conductivity of organic light-emitting devices, in particular devices containing a high energy excited state emitter.

SUMMARY OF THE INVENTION

In a first aspect the invention provides an organic light-emitting device comprising an anode; a cathode; a light-emitting layer between the anode and the cathode; and an electron-transporting layer comprising an electron-transporting material between the cathode and the light-emitting layer, wherein the cathode comprises a layer of a conducting material and a layer of an alkali metal compound between the electron-transporting layer and the layer of conducting material and wherein the electron-transporting material is a polymer comprising arylene repeat units.

Optionally, the device is as described in any of claims 2-15.

In a second aspect the invention provides a method of forming an organic light-emitting device according to the first aspect, the method comprising the step of forming the electron-transporting layer by a solution deposition method using a solvent that does not dissolve the light-emitting layer.

In a third aspect the invention provides an organic light-emitting device comprising an anode; a cathode; a light-emitting layer between the anode and the cathode; and an electron-transporting layer comprising an electron-transporting material between the cathode and the light-emitting layer, wherein the cathode comprises a layer of a conducting material and a layer of an alkali metal compound between the electron-transporting layer and the layer of conducting material and wherein the electron-transporting layer has a work function of 2.3 eV or less.

The device of the third aspect, including the anode, cathode, light-emitting layer and electron-transporting material of the third aspect may be as described with reference to the first aspect.

The device of the third aspect may be formed as described with reference to the second aspect.

"Solvent" as used herein may be a single solvent material or a mixture of two or more solvent materials.

DESCRIPTION OF THE DRAWINGS

The invention will now be described in more detail with reference to the drawings in which.

DETAILED DESCRIPTION OF THE INVENTION

Figure 1:
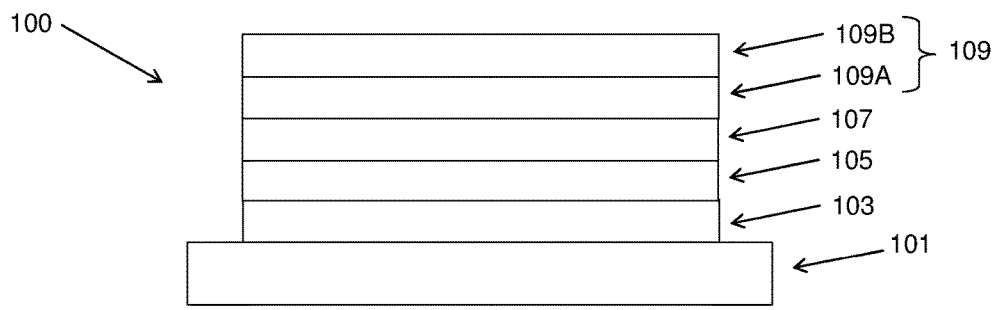
FIG. 1 illustrates schematically an OLED according to an embodiment of the invention.

FIG. 1, which is not drawn to any scale, illustrates an OLED 100 according to an embodiment of the invention supported on a substrate 101, for example a glass or plastic substrate. The OLED 100 comprises an anode 103, a light-emitting layer 105, an electron-transporting layer 107 and a cathode 109 having a first layer 109A and a second layer 109B.

The anode 103 may be single layer of conductive material or may be formed from two or more conductive layers. Anode 103 may be a transparent anode, for example a layer of indium-tin oxide. A transparent anode 103 and a transparent substrate 101 may be used such that light is emitted through the substrate. The anode may be opaque, in which case the substrate 101 may be opaque or transparent, and light may be emitted through a transparent cathode 109.

Light-emitting layer 105 contains at least one light-emitting material. Light-emitting material 105 may consist of a single light-emitting compound or may be a mixture of more than one compound, optionally a host doped with one or more light-emitting dopants. Light-emitting layer 105 may contain at least one light-emitting material that emits phosphorescent light when the device is in operation, or at least one light-emitting material that emits fluorescent light when the device is in operation. Light-emitting layer 105 may contain at least one phosphorescent light-emitting material and at least one fluorescent light-emitting material.

Electron-transporting layer 107 comprises an electron-transporting material.

Cathode 109 comprises cathode layers 109A and 109B. Cathode layer 109A is a layer of an alkali metal compound. Cathode layer 109B is adjacent to cathode layer 109A. Cathode layer 109B is a first conductive layer comprising or consisting of one or more conductive materials. FIG. 1 illustrates a cathode consisting of two layers. In other embodiments, one or more further cathode layers may be present.

The OLED 100 may contain one or more further layers between the anode 103 and the cathode 109, for example one or more charge-transporting, charge-blocking or charge-injecting layers. Preferably, the device comprises a hole-injection layer comprising a conducting material between the anode and the light emitting layer 105. Preferably, the device comprises a hole-transporting layer comprising a semiconducting hole-transporting material between the anode 103 and the light emitting layer 105.

"Conducting material" as used herein means a material having a work function, for example a metal or a degenerate semiconductor.

"Semiconducting material" as used herein means a material having a HOMO and a LUMO level, and a semiconductor layer is a layer comprising a semiconducting material or consisting of one or more semiconducting materials.

The OLED 100 may be a white-emitting OLED. White-emitting OLEDs as described herein may have a CIE x coordinate equivalent to that emitted by a black body at a temperature in the range of 2500-9000K and a CIE y coordinate within 0.05 or 0.025 of the CIE y co-ordinate of said light emitted by a black body, optionally a CIE x coordinate equivalent to that emitted by a black body at a temperature in the range of 2700-6000K. A white-emitting OLED may contain a plurality of light-emitting materials, preferably red, green and blue light-emitting materials, more preferably red, green and blue phosphorescent light-emitting materials, that combine to produce white light. The light-emitting materials may all be provided in light-emitting layer 105, or one or more additional light-emitting layers may be provided.

A red light-emitting material may have a photoluminescence spectrum with a peak in the range of about more than 550 up to about 700 nm, optionally in the range of about more than 560 nm or more than 580 nm up to about 630 nm or 650 nm.

A green light-emitting material may have a photoluminescence spectrum with a peak in the range of about more than 490 nm up to about 560 nm, optionally from about 500 nm, 510 nm or 520 nm up to about 560 nm.

A blue light-emitting material may have a photoluminescence spectrum with a peak in the range of up to about 490 nm, optionally about 450-490 nm.

The photoluminescence spectrum of a material may be measured by casting 5 wt % of the material in a PMMA film onto a quartz substrate to achieve transmittance values of 0.3-0.4 and measuring in a nitrogen environment using apparatus C9920-02 supplied by Hamamatsu.

Host Polymer

Light-emitting layer 105 may contain a semiconducting host material and one or more emissive dopants selected from fluorescent and phosphorescent light-emitting dopants. If one or more fluorescent dopants are present in light-emitting layer 105 then the semiconducting host material preferably has a lowest singlet excited state ($S_1$) energy level that is the same as or higher than the lowest singlet excited state of the fluorescent dopant or dopants. If one or more phosphorescent dopants are present then the semiconducting host material preferably has a lowest triplet excited state ($T_1$) energy level that is the same as or higher than the lowest triplet excited state of the phosphorescent dopant or dopants. Preferably, light-emitting layer 105 comprises a host material and a blue fluorescent or a blue phosphorescent light-emitting material.

Triplet energy levels as described anywhere herein may be measured from the energy onset of the phosphorescence spectrum measured by low temperature phosphorescence spectroscopy (Y. V. Romaovskii et al, Physical Review Letters, 2000, 85 (5), p 1027, A. van Dijken et al, Journal of the American Chemical Society, 2004, 126, p 7718). Triplet energy levels of phosphorescent materials, including the compound of formula (I), may be measured from their room temperature photoluminescence spectra.

The host material preferably has a HOMO-LUMO band gap of at least 4 eV.

The host material preferably has a lowest triplet excited state energy level of at least 2.4 or 2.48 eV, and preferably higher than 2.7 eV The host material preferably has a LUMO that is no more than 2.3 eV, optionally less than 2.3 eV, optionally no more than 2.1 or 2.0 eV, from vacuum level.

The semiconducting host material may be a non-polymeric or polymeric material. A polymeric host may be a homopolymer or a copolymer comprising two or more different repeat units. A polymeric host may be non-conjugated or may be a conjugated polymer comprising repeat units that are conjugated together in the polymer backbone. A conjugated polymer may be a partially conjugated polymer comprising conjugation-limiting repeat units that limit the extent of conjugation across the repeat unit or that provide no conjugation path across the repeat unit. A partially conjugated polymer may comprise highly conjugating repeat units and conjugation limiting repeat units. Conjugation-limiting repeat units may be selected to control the HOMO, LUMO, $S_1$ and/or $T_1$ energy levels of the polymer.

Conjugation-limiting repeat units may be provided in the polymer in an amount in the range of 1-99 mol %, optionally 1-50 mol %.

The conjugation-limiting repeat unit may be a repeat unit of formula (I)

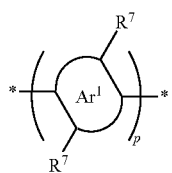
(I)

wherein $Ar^1$ is an arylene group; $R^7$ in each occurrence is H, D or a substituent adjacent to a linking position of the repeat unit with the proviso that at least one $R^7$ is a substituent; and p is at least 1, optionally 1, 2 or 3, preferably 1.

The one or two substituents $R^7$ may be the only substituents of repeat units of formula (I), or one or more further substituents may be present, optionally one or more $C_{1-40}$ hydrocarbyl groups.

One or more substituents $R^7$ provided adjacent to one or both linking positions of the repeat unit create steric hindrance with adjacent repeat units, resulting in twisting of the repeat unit out of the plane of the adjacent repeat unit(s).

Preferably, each group $R^7$ is a substituent.

The one or two substituents $R^7$ adjacent to the linking positions of formula (I) create steric hindrance with one or both repeat units adjacent to the repeat unit of formula (I).

Each $R^7$ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups; and
- a linear or branched chain of aryl or heteroaryl groups, each of which groups may independently be substituted, for example a group of formula —$(Ar^7)_r$— wherein each $Ar^7$ is independently an aryl or heteroaryl group and r is at least 2, preferably a branched or linear chain of phenyl groups each of which may be unsubstituted or substituted with one or more $C_{1-20}$ alkyl groups.

In the case where $R^7$ comprises an aryl or heteroaryl group, or a linear or branched chain of aryl or heteroaryl groups, the or each aryl or heteroaryl group may be substituted with one or more substituents $R^8$ selected from the group consisting of:
- alkyl, for example $C_{1-20}$ alkyl, wherein one or more non-adjacent C atoms may be replaced with O, S, substituted N, C=O and —COO— and one or more H atoms of the alkyl group may be replaced with F;
- $NR^9_2$, $OR^9$, $SR^9$, $SiR^9_3$ and
- fluorine, nitro and cyano;

wherein each $R^9$ is independently selected from the group consisting of alkyl, preferably $C_{1-20}$ alkyl; and aryl or heteroaryl, preferably phenyl, optionally substituted with one or more $C_{1-20}$ alkyl groups.

Substituted N, where present, may be —$NR^6$— wherein $R^6$ is a substituent and is optionally in each occurrence a $C_{1-40}$ hydrocarbyl group, optionally a $C_{1-20}$ alkyl group.

Preferably, each substituent $R^7$ is independently selected from $C_{1-40}$ hydrocarbyl, and is more preferably selected from $C_{1-20}$ alkyl; unsubstituted phenyl; phenyl substituted with one or more $C_{1-20}$ alkyl groups; and a linear or branched chain of phenyl groups, wherein each phenyl may be unsubstituted or substituted with one or more $C_{1-20}$ alkyl groups.

Preferably, $Ar^1$ is phenylene, more preferably 1,4-linked phenylene.

A particularly preferred repeat unit of formula (I) has formula (Ia):

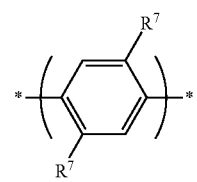
(Ia)

The conjugating host polymer may comprise fluorene repeat units, optionally repeat units of formula (II):

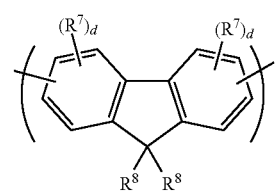
(II)

wherein $R^8$ in each occurrence is the same or different and is a substituent wherein the two groups $R^8$ may be linked to form a ring; $R^7$ is a substituent as described with reference to formula (I); and d is 0, 1, 2 or 3.

Each $R^8$ may independently be selected from the group consisting of:
- alkyl, optionally $C_{1-20}$ alkyl, wherein one or more non-adjacent C atoms may be replaced with optionally substituted aryl or heteroaryl, O, S, substituted N, C=O or —COO—, and one or more H atoms may be replaced with F;
- aryl and heteroaryl groups that may be unsubstituted or substituted with one or more substituents, preferably phenyl substituted with one or more $C_{1-20}$ alkyl groups; and
- a linear or branched chain of aryl or heteroaryl groups, each of which groups may independently be substituted, for example a group of formula —$(Ar^7)_r$— wherein each $Ar^7$ is independently an aryl or heteroaryl group and r is at least 2, optionally 2 or 3, preferably a branched or linear chain of phenyl groups each of which may be unsubstituted or substituted with one or more $C_{1-20}$ alkyl groups.

Preferably, each $R^8$ is independently a $C_{1-40}$ hydrocarbyl group.

Substituted N, where present, may be —$NR^6$— wherein $R^6$ is as described above.

Exemplary substituents $R^7$ are alkyl, for example $C_{1-20}$ alkyl, wherein one or more non-adjacent C atoms may be replaced with O, S, C=O and —COO—, optionally substituted aryl, optionally substituted heteroaryl, alkoxy, alkylthio, fluorine, cyano and arylalkyl. Particularly preferred substituents include $C_{1-20}$ alkyl and substituted or unsubstituted aryl, for example phenyl. Optional substituents for the aryl include one or more $C_{1-20}$ alkyl groups.

Repeat units of formula (II) may be highly conjugating or conjugation limiting repeat units.

The repeat unit of formula (II) may have formula (IIa):

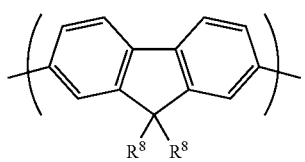

(IIa)

2,7-linked repeat units of formula (IIa) without any substituents $R^7$ are highly conjugating.

Conjugation limiting repeat units of formula (II) may be: (a) linked through the 3- and/or 6-positions, and/or (b) substituted with one or more substituents $R^8$ in one or more positions adjacent to the linking positions.

An exemplary conjugation-limiting repeat unit that provides no conjugation path across the repeat unit has formula (III):

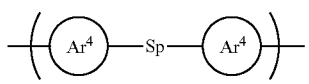

(III)

wherein:

$Ar^4$ in each occurrence independently represents an aryl or heteroaryl group that may be unsubstituted or substituted with one or more substituents; and Sp represents a spacer group comprising at least one carbon or silicon atom.

Sp blocks any conjugation path between the two groups $Ar^4$. Preferably, the spacer group Sp includes at least one $sp^3$-hybridised carbon atom separating the $Ar^4$ groups.

Preferably $Ar^4$ is an aryl group and the $Ar^4$ groups may be the same or different. More preferably each $Ar^4$ is phenyl.

Each $Ar^4$ may independently be unsubstituted or may be substituted with 1, 2, 3 or 4 substituents. The one or more substituents may be selected from:

$C_{1-20}$ alkyl wherein one or more non-adjacent C atoms of the alkyl group may be replaced by O, S or COO, C=O, $NR^6$ or $SiR^6_2$ and one or more H atoms of the $C_{1-20}$ alkyl group may be replaced by F wherein $R^6$ is a substituent and is optionally in each occurrence a $C_{1-40}$ hydrocarbyl group, optionally a $C_{1-20}$ alkyl group; and aryl or heteroaryl, optionally phenyl, that may be unsubstituted or substituted with one or more $C_{1-20}$ alkyl groups.

Preferred substituents of $Ar^4$ are $C_{1-20}$ alkyl groups, which may be the same or different in each occurrence.

Exemplary groups Sp include a $C_{1-20}$ alkylene chain wherein one or more non-adjacent C atoms of the chain may be replaced with O, S, —$NR^6$—, —$SiR^6_2$—, —C(=O)— or —COO—, with the proviso that the alkylene chain contains at least one $sp^3$ hybridised carbon atom separating the two groups $Ar^4$.

Exemplary repeat units of formula (III) include the following, wherein R in each occurrence is H or $C_{1-5}$ alkyl:

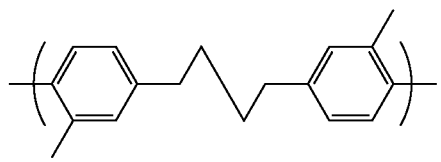

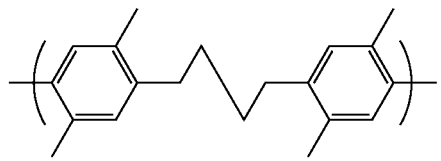

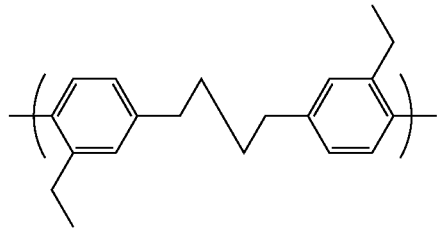

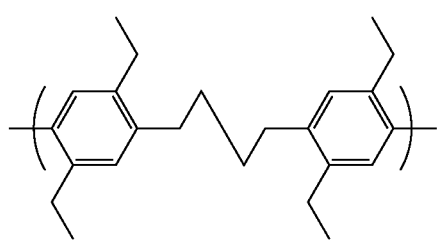

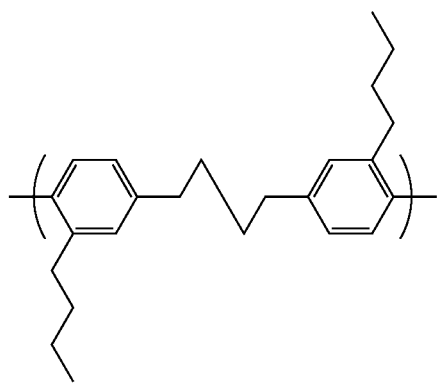

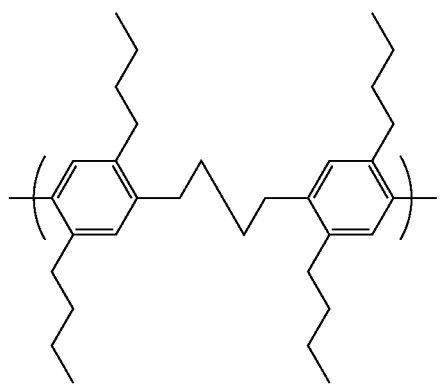

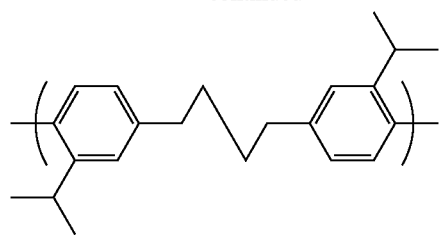
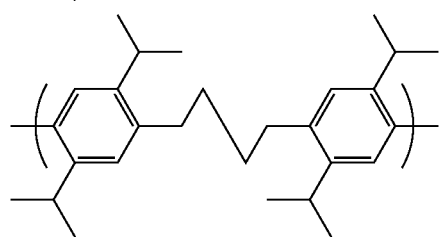
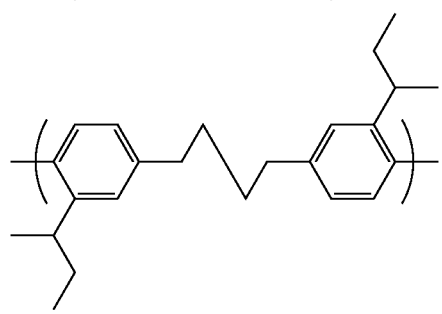
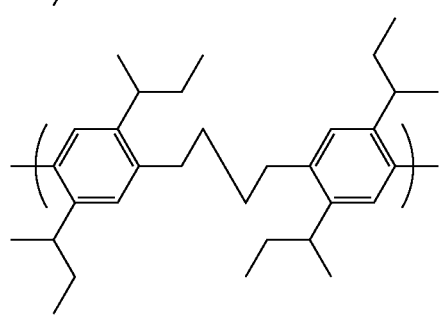
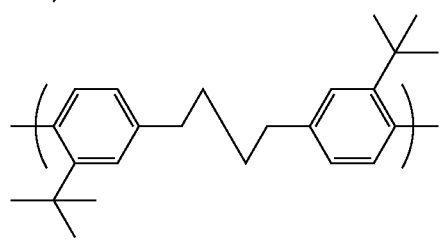
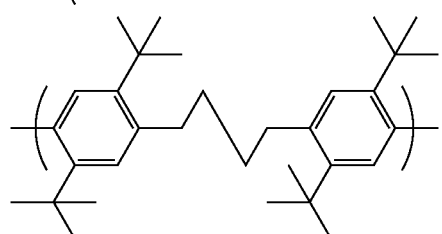
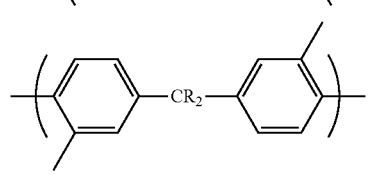
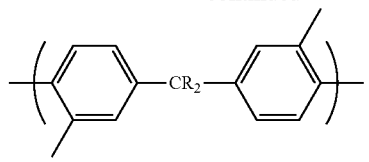
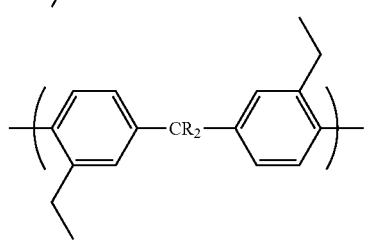
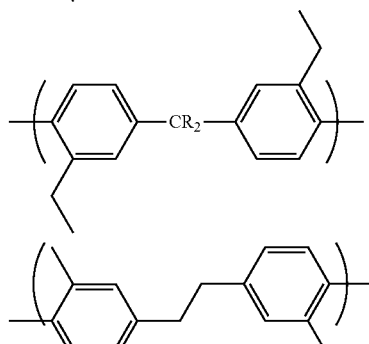
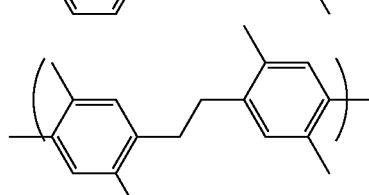
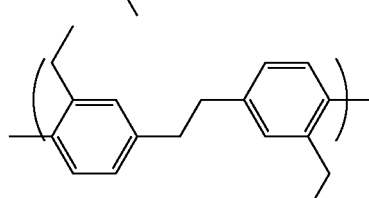
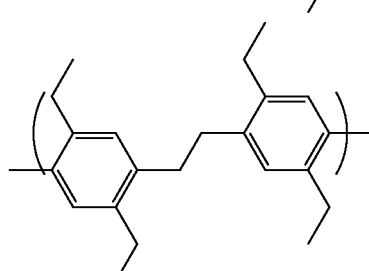
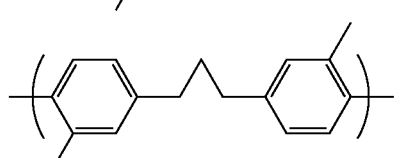
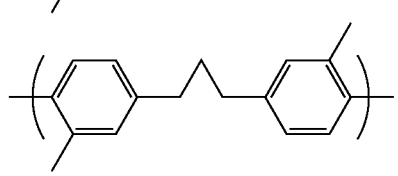

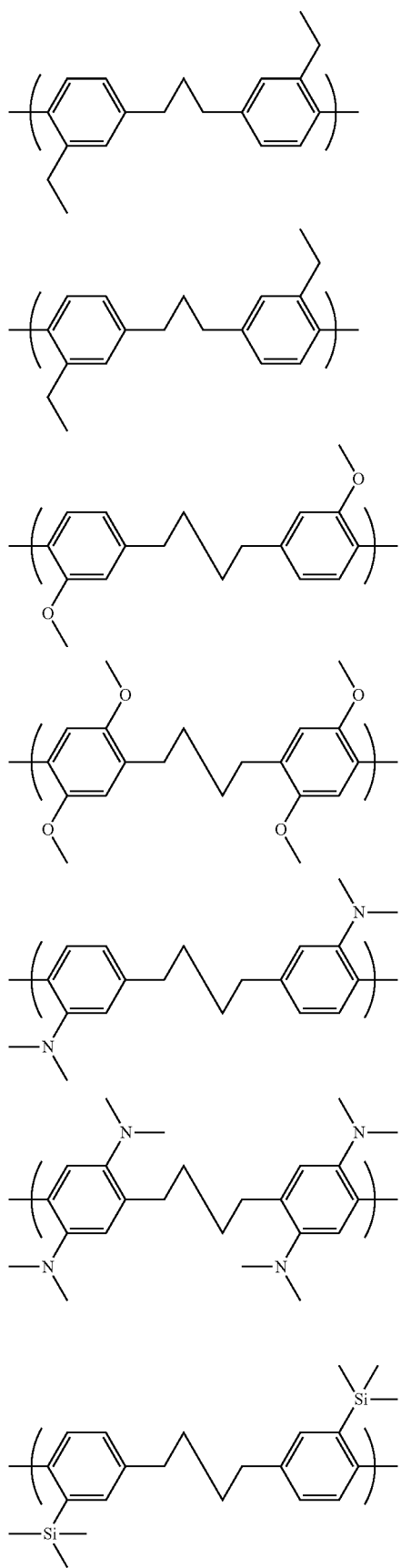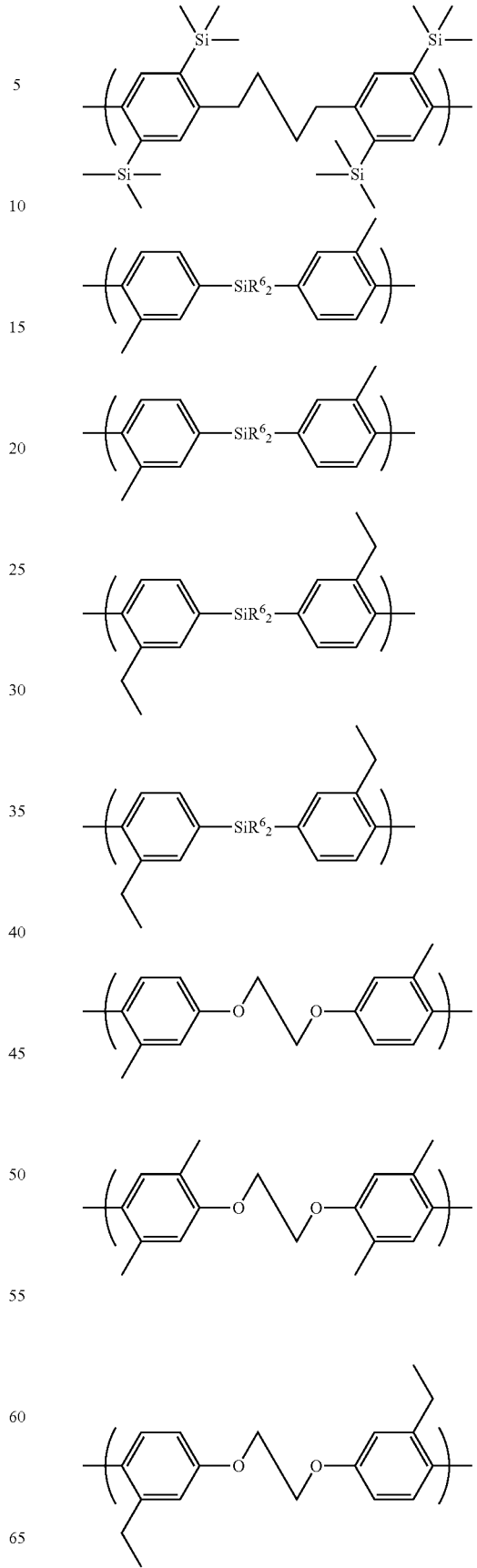

-continued

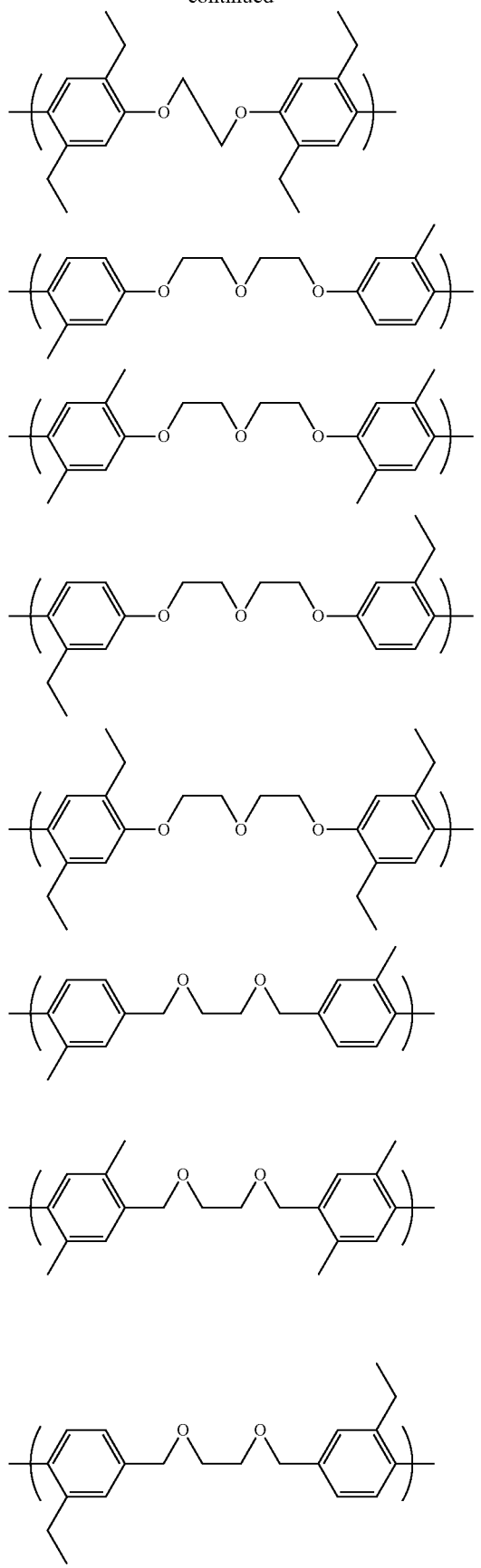

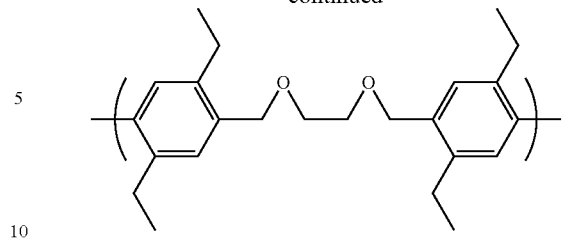

Another exemplary co-repeat unit of formula (III) has formula (IIIa)

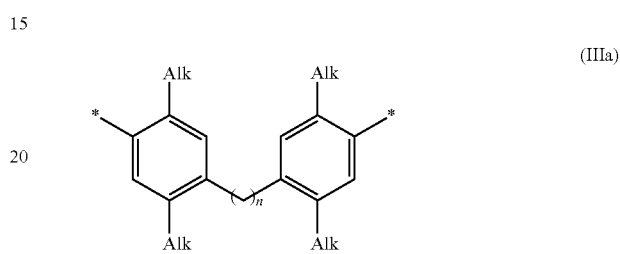

(IIIa)

wherein Alk may be independently selected from alkyl, optionally $C_{1-20}$ alkyl and n is at least 1, optionally 1-6, and wherein one or more non-adjacent C atoms may be replaced with optionally substituted aryl or heteroaryl, O, S, substituted N, C=O or —COO—, and one or more H atoms may be replaced with F.

Preferably, repeating units of the host polymer comprise or consist of at least one repeat unit of formula (IIa) and at least one repeat unit selected from repeat unit of formulae (I) and (III).

Exemplary methods for forming conjugated polymers as described herein are Suzuki polymerisation in the presence of a palladium catalyst and a base, optionally as described in WO 00/53656 or U.S. Pat. No. 5,777,070, the contents of which are incorporated herein by reference, and Yamamoto polymerisation in the presence of a nickel catalyst. These methods form C—C bonds between aromatic or heteroaromatic groups of monomers, and so form polymers having conjugation extending across two or more repeat units.

Light-Emitting Materials

Light-emitting materials of light-emitting layer 105, and any other light-emitting layer of the organic light-emitting device, may each independently be selected from fluorescent or phosphorescent materials.

Phosphorescent light-emitting materials are preferably phosphorescent transition metal complexes, optionally phosphorescent transition metal complexes of formula (IV):

(IV)

wherein M is a metal; each of $L^1$, $L^2$ and $L^3$ is a coordinating group; q is a positive integer; r and s are each independently 0 or a positive integer; and the sum of (a. q)+(b. r)+(c.s) is equal to the number of coordination sites available on M, wherein a is the number of coordination sites on $L^1$, b is the number of coordination sites on $L^2$ and c is the number of coordination sites on $L^3$. Preferably, a, b and c are each 1 or 2, more preferably 2 (bidentate ligand). In preferred embodiments, q is 2, r is 0 or 1 and s is 0, or q is 3 and r and s are each 0.

Heavy elements M induce strong spin-orbit coupling to allow rapid intersystem crossing and emission from triplet or higher states. Suitable heavy metals M include d-block metals, in particular those in rows 2 and 3 i.e. elements 39 to 48 and 72 to 80, in particular ruthenium, rhodium, palladium, rhenium, osmium, iridium, platinum and gold. Iridium is particularly preferred.

Exemplary ligands $L^1$, $L^2$ and $L^3$ include carbon or nitrogen donors such as porphyrin or bidentate ligands of formula (V):

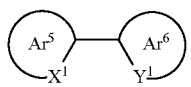

(V)

wherein $Ar^5$ and $Ar^6$ may be the same or different and are independently selected from substituted or unsubstituted aryl or heteroaryl; $X^1$ and $Y^1$ may be the same or different and are independently selected from carbon or nitrogen; and $Ar^5$ and $Ar^6$ may be fused together. Ligands wherein $X^1$ is carbon and $Y^1$ is nitrogen are preferred, in particular ligands in which $Ar^5$ is a single ring or fused heteroaromatic of N and C atoms only, for example pyridyl or isoquinoline, and $Ar^6$ is a single ring or fused aromatic, for example phenyl or naphthyl.

To achieve red emission, $Ar^5$ may be selected from phenyl, fluorene, naphthyl and $Ar^6$ are selected from quinoline, isoquinoline, thiophene and benzothiophene.

To achieve green emission, $Ar^5$ may be selected from phenyl or fluorene and $Ar^6$ may be pyridine.

To achieve blue emission, $Ar^5$ may be selected from phenyl and $Ar^6$ may be selected from imidazole, pyrazole, triazole and tetrazole.

Examples of bidentate ligands are illustrated below:

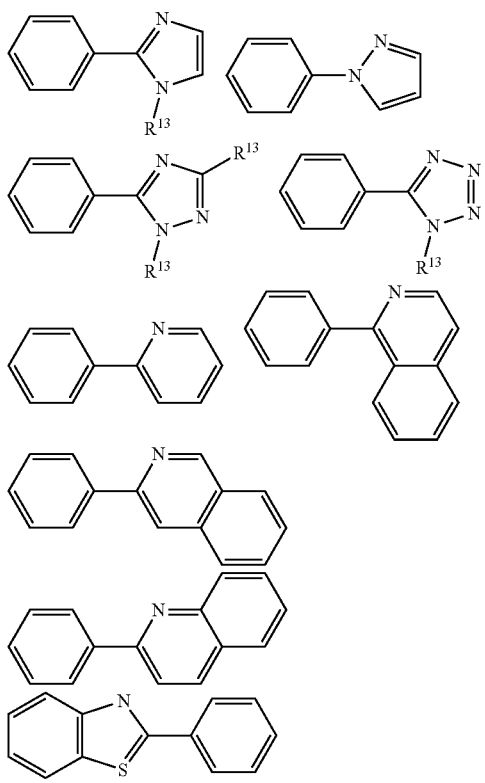

-continued

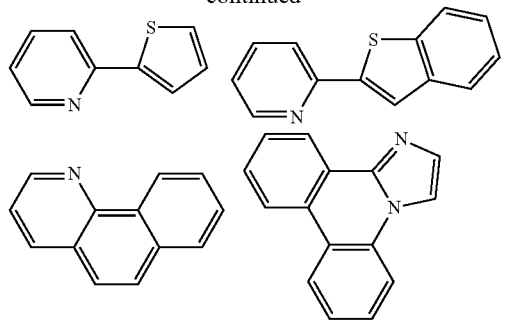

wherein $R^{13}$ is a $C_{1-20}$ hydrocarbyl, optionally $C_{1-10}$ alkyl, unsubstituted phenyl, or phenyl substituted with one or more $C_{1-10}$ alkyl groups.

One or more of $L^1$, $L^2$ and $L^3$ may comprise a carbene group.

Other ligands suitable for use with d-block elements include diketonates, in particular acetylacetonate (acac), tetrakis-(pyrazol-1-yl)borate, 2-carboxypyridyl, triarylphosphines and pyridine, each of which may be substituted.

Each of $Ar^5$ and $Ar^6$ may carry one or more substituents. Two or more of these substituents may be linked to form a ring, for example an aromatic ring.

Exemplary substituents include groups $R^7$ as described above with reference to Formula (I). Particularly preferred substituents include fluorine or trifluoromethyl which may be used to blue-shift the emission of the complex, for example as disclosed in WO 02/45466, WO 02/44189, US 2002-117662 and US 2002-182441; alkyl or alkoxy groups, for example $C_{1-20}$ alkyl or alkoxy, which may be as disclosed in JP 2002-324679; carbazole which may be used to assist hole transport to the complex when used as an emissive material, for example as disclosed in WO 02/81448; phenyl or biphenyl which may be unsubstituted or substituted with one or more $C_{1-10}$ alkyl groups; and dendrons which may be used to obtain or enhance solution processability of the metal complex, for example as disclosed in WO 02/66552.

A light-emitting dendrimer comprises a light-emitting core bound to one or more dendrons, wherein each dendron comprises a branching point and two or more dendritic branches. Preferably, the dendron is at least partially conjugated, and at least one of the branching points and dendritic branches comprises an aryl or heteroaryl group, for example a phenyl group. In one arrangement, the branching point group and the branching groups are all phenyl, and each phenyl may independently be substituted with one or more substituents, for example alkyl or alkoxy.

A dendron may have optionally substituted formula (XI)

(XI)

wherein BP represents a branching point for attachment to a core and $G_1$ represents first generation branching groups.

The dendron may be a first, second, third or higher generation dendron. $G_1$ may be substituted with two or more second generation branching groups $G_2$, and so on, as in optionally substituted formula (XIa):

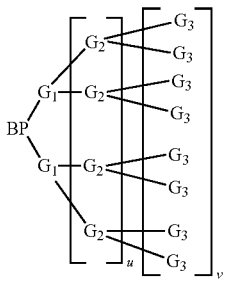
(XIa)

wherein u is 0 or 1; v is 0 if u is 0 or may be 0 or 1 if u is 1; BP represents a branching point for attachment to a core and $G_1$, $G_2$ and $G_3$ represent first, second and third generation dendron branching groups. In one preferred embodiment, each of BP and $G_1$, $G_2$ . . . $G_n$ is phenyl, and each phenyl BP, $G_1$, $G_2$ . . . $G_{n-1}$ is a 3,5-linked phenyl.

In another preferred embodiment, BP is an electron-deficient heteroaryl, for example pyridine, 1,3-diazine, 1,4-diazine, 1,2,4-triazine or 1,3,5-triazine and $G_2$ . . . $G_n$ is an aryl group, optionally phenyl.

Preferred dendrons are a substituted or unsubstituted dendron of formulae (XIb) and (XIc):

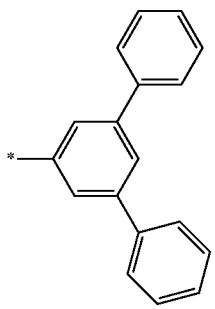
(XIb)

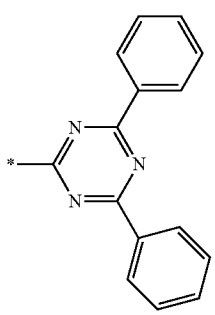
(XIc)

wherein * represents an attachment point of the dendron to a core.

BP and/or any group G may be substituted with one or more substituents, for example one or more $C_{1-20}$ alkyl or alkoxy groups.

Exemplary fluorescent light-emitting compounds have formula (VI):

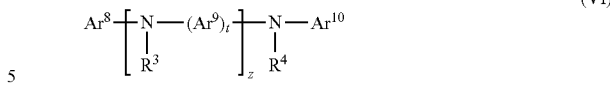
(VI)

wherein $Ar^8$, $Ar^9$ and $Ar^{10}$ in each occurrence are independently selected from substituted or unsubstituted aryl or heteroaryl, each of which may independently be unsubstituted or substituted with one or more substituents; $R^3$ and $R^4$ are each independently a substituent, optionally an aryl or heteroaryl group $Ar^{10}$; z is 1, 2 or 3; t, which may be the same or different in each occurrence if z is 2 or 3, is 1, 2 or 3, preferably 1 or 2.

Preferred divalent linking atoms and groups include O, S; $NR^6$; and $CR^6_2$ wherein $R^6$ independently in each occurrence is a substituent. Preferably, the divalent linking group is $CR^6_2$. Preferably, $R^6$ is a $C_{1-40}$ hydrocarbyl group, optionally a hydrocarbyl group selected from $C_{1-20}$ alkyl, unsubstituted phenyl and phenyl substituted with one or more $C_{1-20}$ alkyl groups.

$Ar^8$, $Ar^9$ and $Ar^{10}$ are preferably an aryl group, more preferably phenyl or fluorene that may be unsubstituted or substituted with one or more substituents.

$R^3$ and $R^4$ may each independently selected from an aryl or heteroaryl group $Ar^{11}$ that may be unsubstituted or substituted with one or more substituents; a branched or linear chain of $Ar^{11}$ groups; a $C_{1-20}$ alkyl group wherein one or more non-adjacent C atoms of the $C_{1-20}$ alkyl group may be replaced with O, S, —C(=O)— or —C(=O)O— and one or more H atoms of the $C_{1-20}$ alkyl group may be replaced with F; and a $C_{1-20}$ alkyl-phenyl group wherein one or more non-adjacent C atoms of the $C_{1-20}$ alkyl group may be replaced with O, S, —C(=O)— or —C(=O)O— and one or more H atoms of the $C_{1-20}$ alkyl group may be replaced with F.

Any two aromatic or heteroaromatic groups selected from $Ar^8$, $Ar^9$, $Ar^{10}$ and $Ar^{11}$ directly bound to the same N atom may be linked by a direct bond or a divalent linking atom or group.

Exemplary groups $R^3$ and $R^4$ include the following, each of which may be unsubstituted or substituted with one or more substituents, and wherein * represents a point of attachment to N:

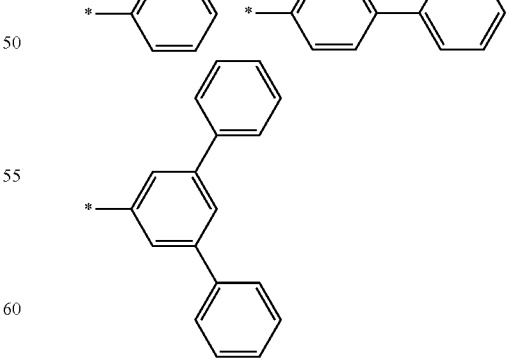

$Ar^8$, $Ar^9$, $Ar^{10}$ and $Ar^{11}$ are each independently unsubstituted or substituted with one or more, optionally 1, 2, 3 or 4 groups $R^{18}$ wherein $R^{18}$ in each occurrence is independently a substituent. Optionally, each $R^{18}$ is independently selected from the group consisting of: phenyl that may be unsubstituted or substituted with one or more $C_{1-10}$ alkyl groups; substituted or unsubstituted alkyl, optionally $C_{1-20}$ alkyl, wherein one or more non-adjacent C atoms may be replaced with optionally substituted aryl or heteroaryl (preferably phenyl), O, S, C=O or —COO— and one or more H atoms may be replaced with F.

A light-emitting material mixed with a host material may form 0.1-50 weight %, optionally 0.1-30 wt % of the weight of the components of the layer containing the phosphorescent material.

If a light-emitting material is covalently bound to a host polymer then repeat units comprising the phosphorescent material, or an end unit comprising the phosphorescent material, may form 0.1-20 mol of the polymer.

Cathode

Cathode layer 109A is a layer of an alkali metal compound. The alkali metal compound is preferably a dielectric material. The layer of alkali metal compound is preferably provided in a thickness in the range of about 0.5-5 nm, optionally 0.5-3 nm.

Cathode layer 109A is preferably adjacent to electron-transporting layer 107.

Preferably, the alkali metal compound is a sodium or potassium compound. Preferably, alkali metal compound is an alkali metal halide, more preferably an alkali metal fluoride.

Exemplary alkali metal compounds include, without limitation, lithium fluoride, sodium fluoride, potassium fluoride, lithium chloride, sodium chloride, potassium chloride, lithium oxide, sodium oxide, potassium oxide, lithium carbonate, sodium carbonate, potassium carbonate and cesium carbonate.

Cathode layer 109B is adjacent to cathode layer 109A. Cathode layer 109B is a first conductive layer. Cathode layer 109B comprises or consists of one or more conductive materials. The or each conductive material preferably has a work function greater than 3.5 eV, optionally greater than 4 eV. Work functions of various metals are given in the CRC Handbook of Chemistry and Physics, 87$^{th}$ Edition, 2007, p. 12-114, published by CRC Press, edited by David R. Lide. Where more than one value is given, the first listed value is applicable.

Exemplary conductive materials are, without limitation, conductive metal oxides, for example indium-tin oxide, and metals. Exemplary metals include, without limitation, aluminium and silver. Preferably, cathode layer 109B is a layer of aluminium. The cathode may consist of cathode layers 109A and 109B, or may contain one or more further cathode layers. Optionally, the cathode contains a further conductive layer adjacent to layer 109B and separated from cathode layer 109A by layer 109B. The or each further conductive layer may be as described with reference to the first conductive layer 109B. Preferably, the cathode contains a single further conductive layer. Preferably, the single further conductive layer comprises or consists of Ag.

Cathode layer 109B, and any further conductive layer, may each have a thickness in the range of about 20-500 nm, optionally about 50-200 nm.

Exemplary cathodes include, without limitation:
NaF/Al; KF/Al; NaF/Al/Ag;
KF/Al/Ag;

Without wishing to be bound by any theory, it is believed that an alkali compound adjacent to a conductive layer 109B may undergo reduction to form elemental alkali metal, and this elemental metal may dope electron-transporting layer 107. Preferably, the alkali compound is adjacent to a conductive layer 109B comprising or consisting of aluminium.

Electron-Transporting Layer

Electron-transporting layer 107 facilitates transport of electrons from the cathode to the light-emitting layer 105. The LUMO level of a material of the light-emitting layer 105 may be shallower (closer to vacuum) than a work function of an alkali metal M of cathode layer 109A, particularly if the material of the light-emitting layer has a wide HOMO-LUMO band gap, such as a host for a blue light-emitting material.

Optionally, the electron-transporting material has a LUMO level less than 2.36 eV, preferably no more than 2.3 eV from vacuum level, optionally no more than 2.1 eV from vacuum level.

Optionally, at least one of conditions (1) and (2) is met:

$$WF_M \leq LUMO_{ETM} \quad (1)$$

$$LUMO_{ETM} \leq LUMO_{EL} \quad (2)$$

For condition (1), preferably $WF_M < LUMO_{ETM}$. For condition (2), preferably $LUMO_{ETM} < LUMO_{EL}$
wherein WFM is the work function of an alkali metal of the alkali compound of cathode layer 109A; $LUMO_{ETM}$ is the LUMO of the electron-transporting material; and $LUMO_{EL}$ is the LUMO of a component of the light-emitting layer 105, preferably the LUMO of a host material of the light-emitting layer.

For the avoidance of any doubt, "less than" as denoted by the symbol < means "further from vacuum".

Optionally, both of conditions (1) and (2) are met to give condition (3):

$$WF_M \leq LUMO_{ETM} \leq LUMO_{EL} \quad (3)$$

Preferably, $WF_M < LUMO_{ETM} < LUMO_{EL}$

The electron-transporting layer preferably has a thickness in the range of about 5-20 nm, optionally about 5-20 nm.

Electron-transporting layer 107 is preferably adjacent to light-emitting layer 105. In the case where the light-emitting layer 105 comprises a phosphorescent emitter, the electron-transporting material 107 may have a higher $T_1$ energy level than that of the phosphorescent emitter. However, the present inventors have found that the electron-transporting material may have a $T_1$ energy level lower than that of the phosphorescent material without adversely affecting efficiency of the device. Without wishing to be bound by any theory, this may be due to a recombination of the device being remote from the interface between the light-emitting layer and the electron-transporting layer due to efficient electron transport in devices of the invention.

The electron-transporting material is preferably a polymer, more preferably a conjugated polymer. Preferably, the conjugated polymer comprises arylene repeat units. Exemplary arylene repeat units are phenylene repeat units, fluorene repeat units, phenanthrene repeat units, dihydrophenanthrene repeat units and indenofluorene repeat units.

The conjugated polymer may be a homopolymer, or a copolymer comprising two or more different repeat units. Each repeat unit comprises a core group, for example an arylene group, in the polymer backbone which may be unsubstituted or substituted with one ore more substituents. The different repeat units may differ in one or more of the structure of the core group; the identity of the substituents; the number of substituents; and the substitution position(s) of the substituent(s). The polymer may be a copolymer comprising two or more different arylene repeat units.

The or each repeat unit of the polymer may independently be unsubstituted or may be substituted with one or more substituents. The substituents may be selected according to their solubilising effect. Accordingly, polar substituents may be selected to enhance solubility of the polymer in polar solvents and non-polar substituents may be selected to enhance solubility of the polymer in non-polar solvents.

Exemplary non-polar substituents are $C_{1-40}$ hydrocarbyl groups, optionally $C_{1-20}$ alkyl and phenyl substituted with one or more $C_{1-20}$ alkyl groups.

Polar substituents include substituents comprising neutral and ionic polar groups.

Exemplary neutral polar groups are $C_{1-20}$ alkoxy wherein one or more non-adjacent C atoms may be replaced with O, optionally a polyether group of formula —O$(C_nH_{2n}O)_m$—CH$_3$ wherein n is at least 1, optionally 1-5, and m is 0 or a positive integer, optionally 1-10.

Exemplary ionic polar groups include groups of formula —COO$^-$M$^+$ wherein M is a metal, optionally an alkali metal, optionally, Li, Na, K, Rb or Cs, or an ammonium group.

A polar substituent may be a group of formula —Ar—(PG)$_k$ wherein Ar is an aryl or heteroaryl group, PG is a polar group and k is at least 1, optionally 1, 2, 3, 4 or 5.

Preferably Ar is a $C_{6-20}$ aryl group, more preferably phenyl.

Each PG may independently be selected from neutral polar groups and ionic polar groups, optionally neutral polar groups and ionic polar groups as described above.

Ar may be substituted with at least one neutral polar substituent and at least one ionic polar substituent.

Ar may be substituted with one or more PG groups only, or may further be substituted with one or more non-polar substituents, optionally a non-polar substituent as described above.

The electron-transporting material may be a polymer comprising repeat units of formula (VII):

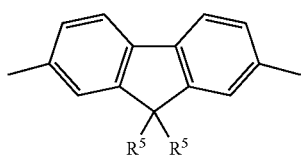

(VII)

wherein R$^5$ independently in each occurrence is a substituent.

Preferably, each R$^5$ is independently one of a non-polar substituent or a group comprising at least one polar substituent described above, more preferably a group of formula —Ar—(PG)$_k$.

Hole-Transporting Layer

A hole transporting layer may be provided between the anode 103 and the light-emitting layer 105.

The hole-transporting layer may be cross-linked, particularly if an overlying layer is deposited from a solution. The crosslinkable group used for this crosslinking may be a crosslinkable group comprising a reactive double bond such and a vinyl or acrylate group, or a benzocyclobutane group. Crosslinking may be performed by thermal treatment, preferably at a temperature of less than about 250° C., optionally in the range of about 100-250° C.

A hole transporting layer may comprise or may consist of a hole-transporting polymer, which may be a homopolymer or copolymer comprising two or more different repeat units.

The hole-transporting polymer may be conjugated or non-conjugated. Exemplary conjugated hole-transporting polymers are polymers comprising arylamine repeat units, for example as described in WO 99/54385 or WO 2005/049546 the contents of which are incorporated herein by reference. Conjugated hole-transporting copolymers comprising arylamine repeat units may have one or more co-repeat units selected from arylene repeat units, for example one or more repeat units selected from fluorene, phenylene, phenanthrene naphthalene and anthracene repeat units, each of which may independently be unsubstituted or substituted with one or more substituents, optionally one or more $C_{1-40}$ hydrocarbyl substituents.

If present, a hole transporting layer located between the anode and the light-emitting layer 105 preferably has a HOMO level of less than or equal to 5.5 eV, more preferably around 4.8-5.5 eV or 5.1-5.3 eV as measured by cyclic voltammetry. The HOMO level of the hole transport layer may be selected so as to be within 0.2 eV, optionally within 0.1 eV, of an adjacent layer in order to provide a small barrier to hole transport between these layers.

Preferably a hole-transporting layer, more preferably a crosslinked hole-transporting layer, is adjacent to the light-emitting layer 105.

A hole-transporting layer may consist essentially of a hole-transporting material or may comprise one or more further materials. A light-emitting material, optionally a phosphorescent material, may be provided in the hole-transporting layer.

A phosphorescent material may be covalently bound to a hole-transporting polymer as a repeat unit in the polymer backbone, as an end-group of the polymer, or as a side-chain of the polymer. If the phosphorescent material is provided in a side-chain then it may be directly bound to a repeat unit in the backbone of the polymer or it may be spaced apart from the polymer backbone by a spacer group. Exemplary spacer groups include $C_{1-20}$ alkyl and aryl-$C_{1-20}$ alkyl, for example phenyl-$C_{1-20}$ alkyl. One or more carbon atoms of an alkyl group of a spacer group may be replaced with O, S, C=O or COO.

A light-emitting material may be blended with or covalently bound to the hole-transporting material. Emission from a light-emitting hole-transporting layer and emission from light-emitting layer 105 may combine to produce white light.

Hole-transporting polymers, host polymers and electron-transporting polymers as described anywhere herein suitably have a polystyrene-equivalent number-average molecular weight (Mn) measured by gel permeation chromatography in the range of about $1\times10^3$ to $1\times10^8$, and preferably $1\times10^3$ to $5\times10^6$. The polystyrene-equivalent weight-average molecular weight (Mw) of the hole-transporting polymers, host polymers and electron-transporting polymers described herein may be $1\times10^3$ to $1\times10^8$, and preferably $1\times10^4$ to $1\times10^7$.

The hole-transporting polymers, host polymers and electron-transporting polymers as described anywhere herein are suitably amorphous polymers.

Hole Injection Layers

A conductive hole injection layer, which may be formed from a conductive organic or inorganic material, may be provided between the anode 103 and the light-emitting layer 105 of an OLED as illustrated in FIG. 1 to assist hole injection from the anode into the layer or layers of semi-conducting polymer. Examples of doped organic hole injection materials include optionally substituted, doped poly (ethylene dioxythiophene) (PEDT), in particular PEDT doped with a charge-balancing polyacid such as polystyrene sulfonate (PSS) as disclosed in EP 0901176 and EP 0947123, polyacrylic acid or a fluorinated sulfonic acid, for example Nafion®; polyaniline as disclosed in U.S. Pat. No. 5,723,873 and U.S. Pat. No. 5,798,170; and optionally substituted polythiophene or poly(thienothiophene). Examples of conductive inorganic materials include transition metal oxides such as VOx MoOx and RuOx as disclosed in Journal of Physics D: Applied Physics (1996), 29(11), 2750-2753.

HOMO and LUMO Level Measurement

HOMO and LUMO levels as described anywhere herein may be measured by square wave voltammetry.

The working electrode potential may be ramped linearly versus time. When square wave voltammetry reaches a set potential the working electrode's potential ramp is inverted. This inversion can happen multiple times during a single experiment. The current at the working electrode is plotted versus the applied voltage to give the cyclic voltammogram trace.

Apparatus to measure HOMO or LUMO energy levels by CV may comprise a cell containing a tert-butyl ammonium perchlorate/or tertbutyl ammonium hexafluorophosphate solution in acetonitrile, a glassy carbon working electrode where the sample is coated as a film, a platinum counter electrode (donor or acceptor of electrons) and a reference glass electrode no leak Ag/AgCl. Ferrocene is added in the cell at the end of the experiment for calculation purposes.

Measurement of the difference of potential between Ag/AgCl/ferrocene and sample/ferrocene.

Method and settings:

3 mm diameter glassy carbon working electrode

Ag/AgCl/no leak reference electrode

Pt wire auxiliary electrode 0.1 M tetrabutylammonium hexafluorophosphate in acetonitrile LUMO=4.8–ferrocene (peak to peak maximum average)+onset Sample: 1 drop of 5 mg/mL in toluene spun at 3000 rpm LUMO (reduction) measurement:

A good reversible reduction event is typically observed for thick films measured at 200 mV/s and a switching potential of −2.5V. The reduction events should be measured and compared over 10 cycles, usually measurements are taken on the $3^{rd}$ cycle. The onset is taken at the intersection of lines of best fit at the steepest part of the reduction event and the baseline. HOMO and LUMO values may be measured at ambient temperature.

Encapsulation

Organic optoelectronic devices tend to be sensitive to moisture and oxygen. Accordingly, the substrate preferably has good barrier properties for prevention of ingress of moisture and oxygen into the device. The substrate is commonly glass, however alternative substrates may be used, in particular where flexibility of the device is desirable. For example, the substrate may comprise one or more plastic layers, for example a substrate of alternating plastic and dielectric barrier layers or a laminate of thin glass and plastic.

The device may be encapsulated with an encapsulant (not shown) to prevent ingress of moisture and oxygen. Suitable encapsulants include a sheet of glass, films having suitable barrier properties such as silicon dioxide, silicon monoxide, silicon nitride or alternating stacks of polymer and dielectric or an airtight container. In the case of a transparent cathode device, a transparent encapsulating layer such as silicon monoxide or silicon dioxide may be deposited to micron levels of thickness, although in one preferred embodiment the thickness of such a layer is in the range of 20-300 nm. A getter material for absorption of any atmospheric moisture and/or oxygen that may permeate through the substrate or encapsulant may be disposed between the substrate and the encapsulant.

Formulation Processing

Light-emitting layer 105 and electron-transporting layer 107 may be formed by any method including evaporation and solution deposition methods. Solution deposition methods are preferred.

Formulations suitable for forming light-emitting layer 105 and electron-transporting layer 107 may each be formed from the components forming those layers and one or more suitable solvents.

Preferably, light-emitting layer 105 does not dissolve in the solvent used to deposit electron-transporting layer 107. Accordingly, light-emitting layer 105 may be substantially free of crosslinking.

Preferably, light-emitting layer 105 is formed by depositing a solution in which the solvent is one or more non-polar solvent materials, optionally benzenes substituted with one or more substituents selected from $C_{1-10}$ alkyl and $C_{1-10}$ alkoxy groups, for example toluene, xylenes and methylanisoles, and mixtures thereof.

Preferably, electron-transporting layer 107 is formed by depositing a solution in which the solvent is one or more polar solvent materials, optionally a $C_{1-5}$ alcohol.

Particularly preferred solution deposition techniques including printing and coating techniques such spin-coating, inkjet printing and lithographic printing.

Coating methods are particularly suitable for devices wherein patterning of the light-emitting layer is unnecessary—for example for lighting applications or simple monochrome segmented displays.

Printing methods are particularly suitable for high information content displays, in particular full colour displays. A device may be inkjet printed by providing a patterned layer over the anode and defining wells for printing of one colour (in the case of a monochrome device) or multiple colours (in the case of a multicolour, in particular full colour device). The patterned layer is typically a layer of photoresist that is patterned to define wells as described in, for example, EP 0880303.

As an alternative to wells, the ink may be printed into channels defined within a patterned layer. In particular, the photoresist may be patterned to form channels which, unlike wells, extend over a plurality of pixels and which may be closed or open at the channel ends.

Other solution deposition techniques include dip-coating, slot die coating, roll printing and screen printing.

EXAMPLES

Device Example 1

Organic light-emitting devices having the following structure were prepared:

ITO/HIL/HTL/LE/ETL/Cathode wherein ITO is an indium-tin oxide anode; HIL is a hole-injecting layer, HTL is a light-emitting, hole-transporting layer and LE is a light-emitting layer.

A glass substrate carrying a 150 nm thick layer of ITO was cleaned using UV/Ozone. The hole injection layer was formed by spin-coating an aqueous formulation of an organic hole-injection material to a thickness of 35 nm and annealing the layer. A hole transporting layer was formed to a thickness of about 20 nm by spin-coating Hole-Transporting Polymer 1 from o-xylene solution and crosslinking the polymer by heating. A light-emitting layer was formed to a thickness of about 70 nm by spin-coating a light-emitting composition of Host Polymer 1 (85.5 wt %), Green Phosphorescent Emitter 1 (1 wt %) and Blue Fluorescent Emitter 1 (13.5 wt %) from o-xylene solution. An electron-transporting layer was formed by spin-coating Electron-Transporting Material 1 from methanol solution to a thickness of about 10 nm. A cathode was formed by evaporating a first cathode layer of sodium fluoride to a thickness of about 2 nm, a second cathode layer of aluminium to a thickness of about 100 nm and a third cathode layer of silver to a thickness of about 100 nm.

Comparative Device 1

A device was prepared as described in Device Example 1 except that the electron-transporting layer was omitted.

Electron-Transporting Polymer 1 is a polymer of the following repeating unit as described in WO 2012/133229, the contents of which are incorporated herein by reference:

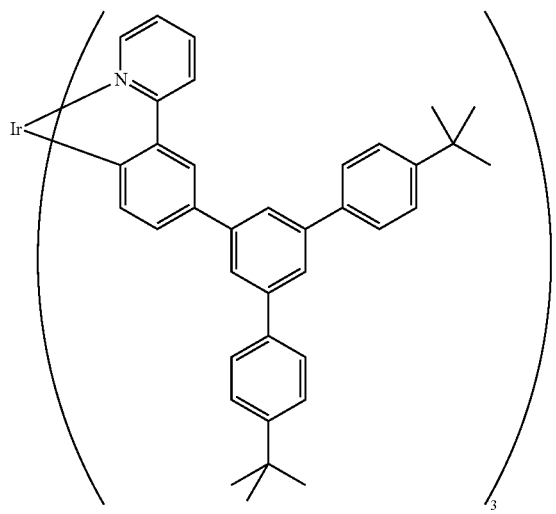

Blue Fluorescent Emitter 1 has the following structure, as described in WO 2013/064814, the contents of which are incorporated herein by reference:

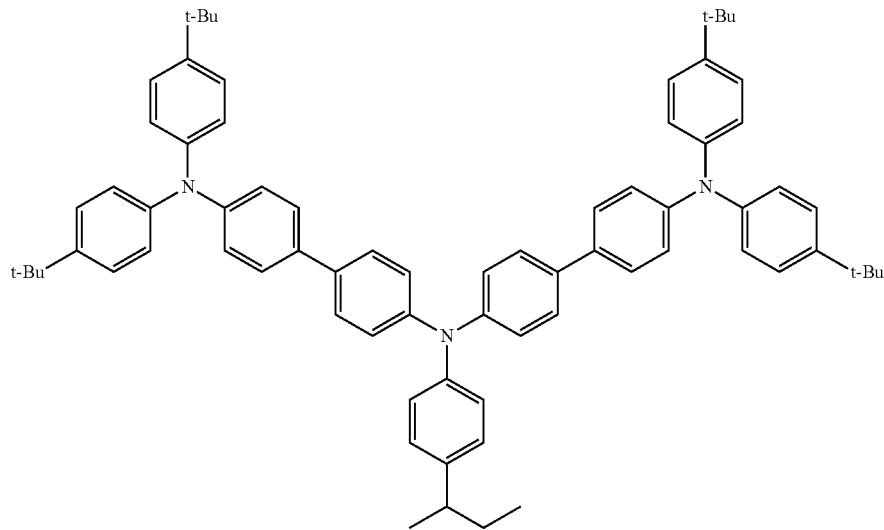 [SMILES: CCC(C)c1ccc(N(c2ccc(-c3ccc(N(c4ccc(C(C)(C)C)cc4)c4ccc(C(C)(C)C)cc4)cc3)cc2)c2ccc(-c3ccc(N(c4ccc(C(C)(C)C)cc4)c4ccc(C(C)(C)C)cc4)cc3)cc2)cc1]

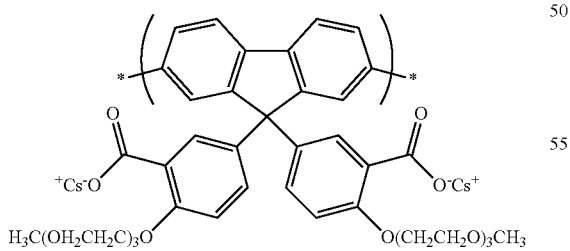

Electron-Transporting Polymer 1 has a LUMO level of 2.30 eV as measured by square wave cyclic voltammetry.

Green Phosphorescent Emitter 1 is a dendrimer as described in WO 02/066552, the contents of which are incorporated herein by reference, having the following structure:

Host Polymer 1 was formed by Suzuki polymerisation as described in WO 00/53656 of the following monomers:

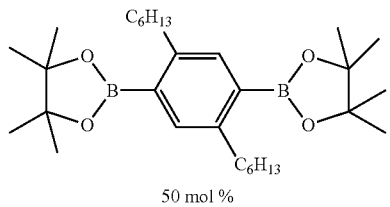

50 mol %

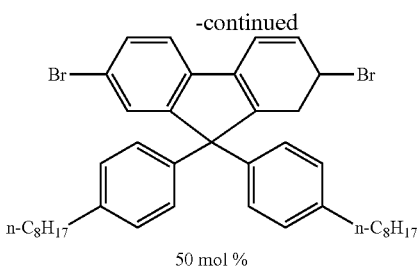

50 mol %

Host Polymer 1 has a LUMO level of 1.9 eV and a $T_1$ value of 2.48 eV

Hole-Transporting Polymer 1 was formed by Suzuki polymerisation as described in WO 00/53656 of the following monomers:

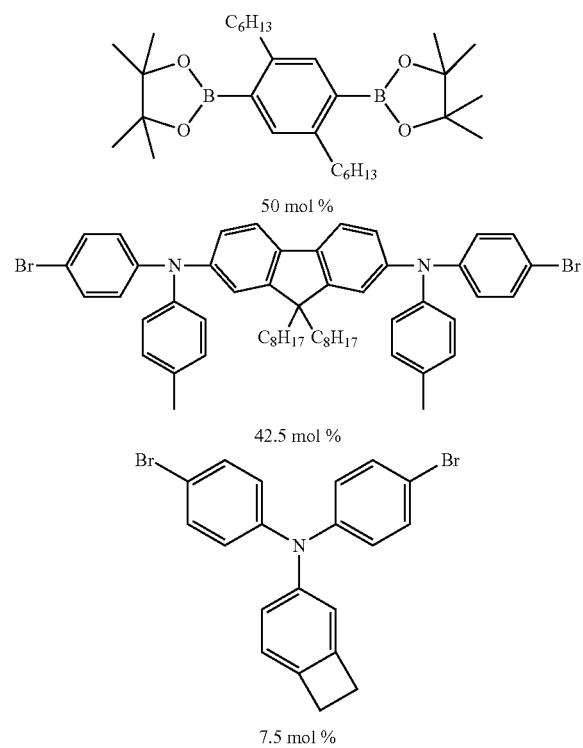

Figure 2:
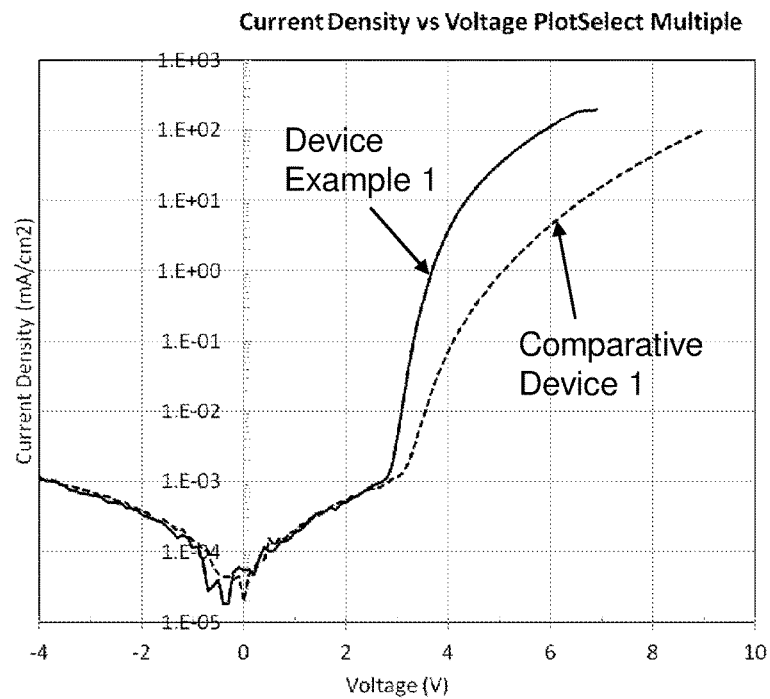
FIG. 2 is a graph of current density vs. voltage for a device according to an embodiment of the invention and a comparative device.

FIG. 2 is a graph of current density (log scale) vs. voltage for Device Example 1 and Comparative Device 1. Device Example 1 has a current density that is about 1-2 orders of magnitude greater than that of Comparative Device 1 at any given voltage above about 3V.

The voltage required to reach a current density of 10 mA/cm² is 6.6 V for Comparative Device 1 and 4.3 V for Device Example 1.

Figure 3:
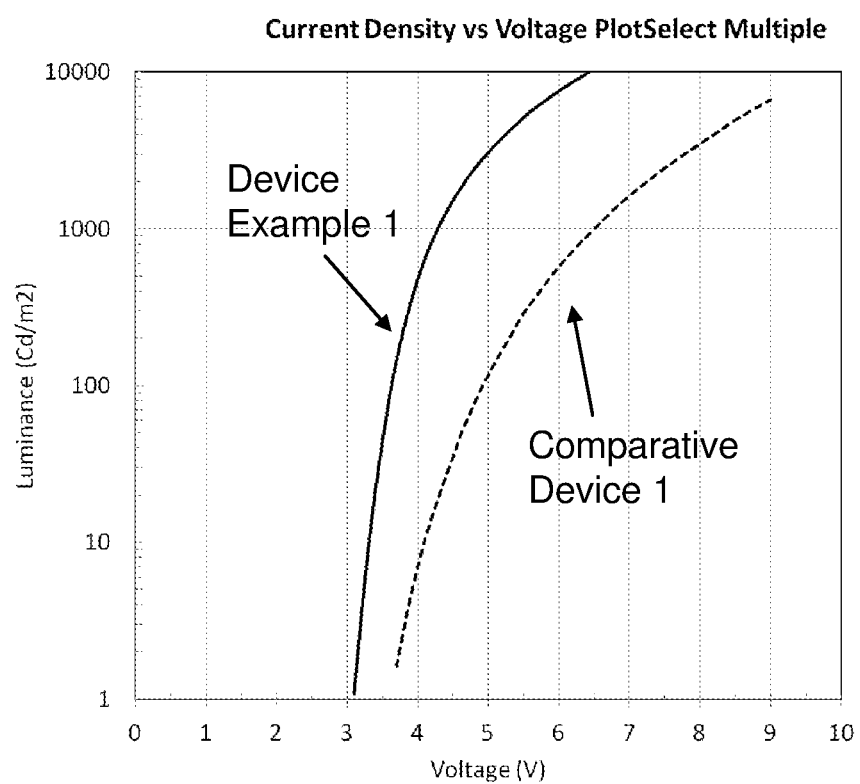
FIG. 3 is a graph of current density vs. luminance for a device according to an embodiment of the invention and a comparative device.

With reference to FIG. 3, the luminance of Device Example 1 is greater at any given voltage than for Comparative Device 1. The drive voltage required for a brightness of 1000 cd/m² is 6.5 V for Comparative Device 1 and 4.3V for Device Example 1.

The efficiency at a brightness of 1000 cd/m² is 5.3 Lm/W for Comparative Device 1 and 8.7 Lm/W for Device Example 1.

Although the present invention has been described in terms of specific exemplary embodiments, it will be appreciated that various modifications, alterations and/or combinations of features disclosed herein will be apparent to those skilled in the art without departing from the scope of the invention as set forth in the following claims.

The invention claimed is:

1. An organic light-emitting device comprising an anode; a cathode; a light-emitting layer between the anode and the cathode; and an electron-transporting layer comprising an electron-transporting material between the cathode and the light-emitting layer, wherein the cathode comprises a layer of a conducting material and a layer of an alkali metal compound between the electron-transporting layer and the layer of conducting material, wherein the electron-transporting material is a conjugated polymer comprising arylene repeat units, wherein the light-emitting layer comprises a host material and a light-emitting dopant, and wherein the host material has a LUMO level that is no more than 2.1 eV from vacuum level.

2. The organic light-emitting device according to claim 1 wherein the conjugated polymer has a LUMO level less than 2.36 eV from vacuum level.

3. The organic light-emitting device according to claim 1 wherein the conjugated polymer has a LUMO level no more than 2.3 eV from vacuum level.

4. The organic light-emitting device according to claim 1 wherein the conjugated polymer comprises fluorene repeat units.

5. The organic light-emitting device according to claim 4 wherein the conjugated polymer comprises repeat units of formula (VII):

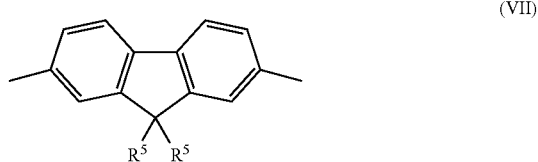

(VII)

wherein $R^5$ independently in each occurrence is a substituent.

6. The organic light-emitting device according to claim 5 wherein at least one $R^5$ is a group of formula —Ar-(PG)$_k$ wherein Ar is an aryl or heteroaryl group, PG is a polar group and k is at least 1.

7. The organic light-emitting device according to claim 1 wherein the host material is a partially conjugated polymer.

8. The organic light-emitting device according to claim 1 wherein the alkali metal compound is an alkali metal fluoride.

9. The organic light-emitting device according to claim 1 wherein the alkali metal compound is a sodium or potassium compound.

10. The organic light-emitting device according to claim 1 wherein the layer of conducting material is a metal.

11. The organic light-emitting device according to claim 10 wherein the metal is aluminium.

12. The organic light-emitting device according to claim 1 wherein cathode comprises a further layer of a conducting material.

13. The organic light-emitting device according to claim 12 wherein the further layer of conducting material is a layer of silver.

14. A method of forming an organic light-emitting device comprising an anode; a cathode; a light-emitting layer between the anode and the cathode; and an electron-transporting layer comprising an electron-transporting material between the cathode and the light-emitting layer, wherein the cathode comprises a layer of a conducting material and a layer of an alkali metal compound between the electron-transporting layer and the layer of conducting material and wherein the electron-transporting material is a conjugated polymer comprising arylene repeat units, wherein the light-emitting layer comprises a host material and a light-emitting dopant, and wherein the host material has a LUMO level that is no more than 2.1 eV from vacuum level, the method comprising the step of forming the electron-transporting layer by a solution deposition method using a solvent that does not dissolve the light-emitting layer.

15. The method according to claim 14 wherein the solvent is a polar solvent.

16. The method according to claim 15 wherein the light-emitting layer is deposited by a solution deposition method using a non-polar solvent.

17. An organic light-emitting device comprising an anode; a cathode; a light-emitting layer between the anode and the cathode; and an electron-transporting layer comprising an electron-transporting material between the cathode and the light-emitting layer, wherein the cathode comprises a layer of a conducting material and a layer of an alkali metal compound between the electron-transporting layer and the layer of conducting material, wherein the electron-transporting material has a LUMO level no more than 2.3 eV from vacuum level; wherein the light-emitting layer comprises a host material and a light-emitting dopant, and wherein the host material has a LUMO level that is no more than 2.1 eV from vacuum level.

* * * * *